(12) United States Patent
Dussarrat et al.

(10) Patent No.: US 8,753,718 B2
(45) Date of Patent: Jun. 17, 2014

(54) METHOD FOR THE DEPOSITION OF A RUTHENIUM-CONTAINING FILM

(71) Applicant: L'Air Liquide, Société Anonyme pour l'Etude et l'Exploitation des Procédés Georges Claude, Paris (FR)

(72) Inventors: Christian Dussarrat, Tokyo (JP); Julien Gatineau, Tsuchiura (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 13/773,354

(22) Filed: Feb. 21, 2013

(65) Prior Publication Data

US 2013/0252438 A1    Sep. 26, 2013

Related U.S. Application Data

(63) Continuation of application No. 11/909,399, filed as application No. PCT/EP2006/066639 on Sep. 22, 2006, now Pat. No. 8,404,306.

(51) Int. Cl.
*C23C 16/00*  (2006.01)
*H01L 21/02*  (2006.01)

(52) U.S. Cl.
USPC ......... 427/252; 427/250; 427/248.1; 556/136

(58) Field of Classification Search
None
See application file for complete search history.

(56) References Cited

U.S. PATENT DOCUMENTS

| 4,927,670 | A | 5/1990 | Erbil |
|---|---|---|---|
| 5,314,727 | A | 5/1994 | McCormick et al. |
| 5,372,849 | A | 12/1994 | McCormick et al. |
| 5,496,582 | A | 3/1996 | Mizutani et al. |

(Continued)

FOREIGN PATENT DOCUMENTS

| EP | 1 717 343 | 11/2006 |
|---|---|---|
| JP | 11 317177 | 11/1999 |

(Continued)

OTHER PUBLICATIONS

JP2006-057112, Sakai, Mar. 2006—English machine translation.*

(Continued)

*Primary Examiner* — Joseph Miller, Jr.
(74) *Attorney, Agent, or Firm* — Patricia E. McQueeney

(57) ABSTRACT

The invention concerns the use of the ruthenium-containing precursor having the formula ($R_n$-chd)Ru(CO)$_3$, wherein:
($R_n$-chd) represents a cyclohexadiene (chd) ligand substituted with n substituents R, any R being in any position on the chd ligand;
n is an integer comprised between 1 and 8 ($1 \le n \le 8$) and represents the number of substituents on the chd ligand;
R is selected from the group consisting of C1-C4 linear or branched alkyls, alkylamides, alkoxides, alkylsilylamides, amidinates, carbonyl and/or fluoroalkyl for R being located in any of the eight available position on the chd ligand, while R can also be oxygen O for substitution on the C positions in the chd cycle which are not involved in a double bond
for the deposition of a Ru containing film on a substrate.

19 Claims, 3 Drawing Sheets

(56) References Cited

U.S. PATENT DOCUMENTS

| | | | |
|---|---|---|---|
| 5,840,897 | A | 11/1998 | Kirlin et al. |
| 5,962,716 | A | 10/1999 | Uhlenbrock et al. |
| 6,063,705 | A | 5/2000 | Vaartstra |
| 6,074,945 | A | 6/2000 | Vaartstra et al. |
| 6,133,159 | A | 10/2000 | Vaartstra et al. |
| 6,281,125 | B1 | 8/2001 | Vaartstra et al. |
| 6,380,080 | B2 | 4/2002 | Visokay |
| 6,420,583 | B1 | 7/2002 | Lienhard et al. |
| 6,429,127 | B1 | 8/2002 | Derderian et al. |
| 6,517,616 | B2 | 2/2003 | Marsh et al. |
| 6,541,067 | B1 | 4/2003 | Marsh et al. |
| 6,617,248 | B1 | 9/2003 | Yang |
| 6,844,261 | B2 | 1/2005 | Marsh et al. |
| 6,897,160 | B2 | 5/2005 | Derderian et al. |
| 6,919,468 | B2 | 7/2005 | Thompson et al. |
| 7,018,675 | B2 | 3/2006 | Yang |
| 7,144,810 | B2 | 12/2006 | Derderian et al. |
| 7,316,962 | B2 | 1/2008 | Govindarajan |
| 2002/0013052 | A1 | 1/2002 | Visokay |
| 2002/0053299 | A1 | 5/2002 | Marsh et al. |
| 2002/0164887 | A1 | 11/2002 | Tomita et al. |
| 2003/0073294 | A1 | 4/2003 | Marsh |
| 2003/0092262 | A1 | 5/2003 | Marsh et al. |
| 2005/0009346 | A1 | 1/2005 | Miyajima |
| 2006/0162658 | A1 | 7/2006 | Weidman |
| 2006/0165892 | A1 | 7/2006 | Weidman |
| 2006/0165894 | A1 | 7/2006 | Yang |
| 2006/0240190 | A1 | 10/2006 | Sakai et al. |
| 2006/0246699 | A1 | 11/2006 | Weidman et al. |
| 2008/0152793 | A1 | 6/2008 | Gatineau et al. |
| 2009/0236568 | A1 | 9/2009 | Letessier et al. |
| 2010/0221577 | A1 | 9/2010 | Dussarrat |

FOREIGN PATENT DOCUMENTS

| | | | |
|---|---|---|---|
| JP | 2002 212112 | | 7/2002 |
| JP | 2002 2611088 | | 9/2002 |
| JP | 2006 057112 | | 3/2006 |
| JP | 2006-057112 | * | 3/2006 |
| WO | WO 00 12777 | | 3/2000 |
| WO | WO 00 12779 | | 3/2000 |
| WO | WO 00 15865 | | 3/2000 |
| WO | WO 2004 046417 | | 6/2004 |
| WO | WO 2008 034468 | | 3/2008 |
| WO | WO 2008 078296 | | 7/2008 |
| WO | WO 2008 088563 | | 7/2008 |
| WO | WO 2009 118708 | | 10/2009 |
| WO | WO 2011 132116 | | 10/2011 |

OTHER PUBLICATIONS

Burkey, D.J. et al. "Encapsulated alkaline-earth metallocenes, 2. Triisopropylcyclopentadienyl systems, $[(C_3H_7)_3C_5H_2]_2Ae(THF)_n$ (Ae=Ca, Sr, Ba; n=0-2), and the crystal structure of $[(C_3H_7)_3C_5H_2]_2Ba(THF)_2$," Organometallics, vol. 12, No. 4, 1993, pp. 1331-1337.

Bottrill, M. at al., Reactions of co-ordinated Ligands. Part 16. The oxidative-addition of hexafluorobut-2-yne and 3,3,3-trifluoroprop-1-yne to tricarbonyl(1,3-diene)-iron and -ruthenium and tricarbonyl(diphenyl-o-styrylphosphine)-iron complexes: Crystal and molecular structure of $[Ru(CO)_2\{P(OCH_2)_3\text{-}CMe\}(C_8H_8)(C_4F_6)_2]$, J. Chem. Soc., Jan. 1977, pp. 1262-1261.

Fröhlich, K. et al., "Preparation of Sr $RuO_3$ films for advanced CMOS metal gates," Materials Science in Semiconductor Processing 7 (2004), pp. 285-269.

Hatanpää, T. at al., "Synthesis and characterisation of cyclopentadienyl complexes of barium: Precursors for atomic layer deposition of $BaTiO_3$," Dalton Transactions, Mar. 8, 2004, pp. 1181-1188.

Ingham, S.L. et al., "The synthesis, structure and selected reactivity of a series of tricarbonyl ruthenium complexes with 1,3-diener and heterodynes," Journal of Organometailic Chemistry 574 (1999), pp. 302-310.

Kang, J. et al., "Metal-organic CVD of a $(Ba,Sr)RuO_3$ oxide electrode using a single cocktail source," Chemical Vapor Deposition 11 2005, pp. 17-20.

Kanjolia, R.K. et al., "Design and development of ALD precursors for microelectronics," ECS Transactions, (2008) 16 (4), pp. 79-86.

Kiruss, R.U., "Synthesis, characterization and spectroscopy of alkyl substituted edge-bridged open ruthenocenes," Inorganica Chimica Acta 357 (2004), pp. 3181-3186.

Kukli, K. et al., "Atomic layer deposition of calcium oxdie and calcium hafnium oxide films using calcium cyclopentadienyl precursor," Thin Solid Films 500 (2006), pp. 322-329.

Shibutami, T. et al. "Novel ruthenium precursor for MOCVD without seed ruthenium layer," Tosoh R&D Review, 47, 2003, pp. 61-64.

Shibuya, K. et al. "Domain structure of epitaxial $CaHfO_3$ gate insulator films on $SrTiO_3$," Appl. Phys. Let. 84 (2004) 2142-2144.

Shibuya, K. et al. "Growth and structure of wide-gap insulator films on $SrTiO_3$," Solid State Electron., 47 (2003) 2211-2214.

Sigma-Aldrich, "SAFC Expansion in Far East," Insight newsletter, Apr. 2008.

Song, Y.T. et al. "Atomic layer deposition of Ru by using a new Ru-precursor," ECS Transactions, 2 (4) 2006, pp. 1-11.

Sosinsky, B.A. et al. "Hydrocarbon complexes of ruthenium. IV. Cyclic dienyl complexes," J. Chemical Society, Daltan Transactions, Chemical Society. Letchworth, GB, 1974, pp. 1633-1640.

Strem MSDS (Ruthenocene Oct. 2004) {http://www.strem.com/catalog/v3/44-6200/}.

Studebaker, D. et al. "Low field, room temperature magnetoresistance in $(La_{y-x}M_x)_yMnO_{3-\delta}$ (M=Ca, Sr) thin-films deposited by liquid delivery CVD," Materials Science and Engineering B56 (1998) pp. 168-172.

Vehkamaki, M. et al. "Atomic layer deposition of $BaTiO_3$ thin films—Effect of barium hydroxide formation," Chemical Vapor Deposition, vol. 13, No. 5, May 1, 2007, pp. 239-246.

International Search Report and Written Opinion for related PCT/EP2006/066639, Feb. 22, 2007.

* cited by examiner

METHOD FOR THE DEPOSITION OF A RUTHENIUM-CONTAINING FILM

CROSS REFERENCE TO RELATED APPLICATIONS

This is a continuation application of U.S. patent application Ser. No. 11/909,399 filed May 17, 2010, currently pending, which is a 371 of International PCT Application PCT/EP2006/066639, filed Sep. 22, 2006.

BACKGROUND

Ruthenium (Ru) is expected to be introduced in the industrial semiconductor manufacturing process for many applications in the coming years. This move towards the use of new materials for chip manufacturing is necessary to solve issues generated by the continuous scaling trend imposed to the industry. For the next generation nodes, Ru is considered as the best candidate for the electrode capacitor for FeRAM and DRAM applications. Ru has the required properties, such as high melting point, low resistivity, high oxidation resistance and adequate work function, making it a potential gate electrode material for CMOS transistor. Ru has advantages compared to iridium and platinum due to its lower resistivity and Ru ease of dry etching. Additionally, $RuO_2$ has a high conductivity so the formation of Ru oxide by diffusion of oxygen, that could come from ferroelectric films (PZT, SBT, BLT, . . . ), will have less impact on electrical properties than other metal oxides known to be more insulating.

Ru is also a promising BEOL process candidate as a liner material for copper. A single Ru film would replace the Ta, Ta(Si)N, and the copper seed layer. A Ru process replaces the two steps Ta/Ta(Si)N process with a single step.

A large variety of Ru CVD precursors are available and many have been studied. However, the currently available precursors have a very low vapor pressure (i.e. 0.1 Torr at 73° C. for $Ru(EtCp)_2$). The Ru films obtained with these known precursors contain significant amounts of carbon and oxygen impurities. The C impurities are suspected to come from the precursor material. The O impurity comes from the co-reactant gas ($O_2$). It is known from T. Shibutami et al, Tosoh R&D Review, 47, 2003, that Ru films have poor adherence, uniformity and also have a characteristically long incubation time.

It is known from e.g. U.S. Pat. No. 6,897,160, to use Ru precursors such as tricarbonyl (1,3-cyclohexadiene) Ru precursor to deposit rough ruthenium oxide layers, wherein said particular precursor (see example 4 of said patent) is held in a bubbler reservoir at room temperature (about 25° C.) and helium is bubbled through it.

However, as explained in U.S. Pat. No. 6,517,616 to the same assignee, such $Ru(CO)_3(1,3$-cyclohexadiene) product is not liquid at room temperature (it melts at about 35° C.) and it is necessary to dissolve such precursor in a solvent in order to obtain a liquid solution of precursor and solvent through which the inert gas such as helium is bubbled (U.S. Pat. No. 6,517,616 discloses in great details ruthenium precursors solutions in solvents—see also U.S. Pat. No. 5,962,716).

$Ru(CO)_3(1,3$-cyclohexadiene) is disclosed also in the article of Y. W. Song et al., ECS transactions, 2(4), 1-11, 2006, including its solid nature at ambient temperature, with a melting point of 35° C.

All the known precursors of Ru containing a CO molecule have essentially the same drawbacks which is their high melting point such solid products require the use of a solvent in order to handle a liquid product through which can be delivered into the reactor either through direct vaporization or by bubbling an inert gas through it.

However, the use of a solvent is usually viewed as having a bad influence on the deposition process due to the intrusion of the solvent particles in the reactor and the incorporation of undesired impurities in the deposited films. Moreover, the solvents used are usually toxic and/or flammable and their usage brings many constraints (safety aspects, environmental issues). Besides, the use of precursors with melting points higher than 20° C. (and even for those having a melting point above 0° C.) implies many additional constraints during the process deposition (heating of the delivery lines to avoid condensation of the precursor at undesired locations) and during the transportation.

The reactivity of the known CO containing precursors does not enable today to reach an ALD deposition regime. Ruthenium films are only deposited by CVD and some articles even outline that ALD mode is not possible with the $Ru(CO)_3(1,3$-cyclohexadiene) precursor.

DETAILED DESCRIPTION

It is an object to provide ruthenium precursors which are in liquid state at room temperature and more preferably in liquid state at temperatures above 0° C., which can be provided as pure liquids, without the addition of a solvent, which enable the deposition of pure ruthenium films or of ruthenium-containing films depending on the co-reactant used with the precursor, whose resulting films are deposited without detectable incubation time, and for which an ALD regime can be obtained for pure ruthenium deposition as well as for deposition of other ruthenium-containing films ($RuO_2$ as an example).

Accordingly there is provided a process for the deposition of a ruthenium-containing film on a substrate, comprising the steps of:
  a) providing at least one substrate into a reactor;
  b) introducing into the said reactor at least one ruthenium-containing precursor having the formula:

wherein
  ($R_n$-chd) represents one cyclohexadiene (chd) ligand, substituted with n substituents R, any R being in any position on the chd ligand;
  n is an integer comprised between 1 and 8 ($1 \leq n \leq 8$) and represents the number of substituents on the chd ligand;
  R is selected from the group consisting of C1-C4 linear or branched alkyl, alkylamides, alkoxides, alkylsilyamides, amidinates, carbonyl and/or fluoroalkyl for R being located in any of the eight available positions on the chd ligand, while R can also be oxygen O for substitution on the C positions in the chd cycle which are not involved in a double bond;
  unsubstituted positions on the chd ligand are occupied by H molecules;
  c) decomposing said at least one ruthenium-containing precursor under temperature conditions above 100° C.;
  d) depositing said ruthenium-containing film onto said at least one substrate.

Preferably, at least one R substituents is located on a carbon atom of the ligand involved a double bond, more preferably in a double bond with another carbon atom.

According to a preferred embodiment, n=1 and R is a C1-C4 alkyl group, preferably R is a methyl or ethyl group.

According to another embodiment, the ruthenium precursor formula is Ru(CO)$_3$(1-Me 1,4-chd) i.e. (1-methylcyclohexa 1,4 diene)tricarbonyl ruthenium Preferably to a further embodiment, there is at least one R on a carbon of the chd ligand not involved in a double bond.

Preferably, the temperature conditions are selected into a range from 100° C. to 500° C., more preferably from 150° C. to 350° C.

The pressure into the reactor shall be preferably maintained between 1 Pa and 10$^5$ Pa, more preferably between 25 Pa and 10$^3$ Pa.

The process of the invention may further comprise the step of providing at least one reducing fluid into the reactor, said reducing fluid being preferably selected from the group consisting of H$_2$, NH$_3$, SiH$_4$, Si$_2$H$_6$, Si$_3$H$_8$, hydrogen containing fluids and mixtures thereof.

The process of the invention may also further comprise the step of providing at least one oxygen containing fluid into the reactor, preferably selected from the group consisting of O$_2$, O$_3$, H$_2$O, H$_2$O$_2$, oxygen containing radicals such as 0° or OH° and mixtures thereof.

The present invention also relates to the use of the ruthenium-containing precursor having the formula:

(R$_n$-chd)Ru(CO)$_3$, wherein
(R$_n$-chd) represents a cyclohexadiene (chd) ligand substituted with n substituents R, any R being in any position on the chd ligand;
n is an integer comprised between 1 and 8 (1≤n≤8) and represents the number of substituents on the chd ligand;
R is selected from the group consisting of C1-C4 linear or branched alkyls, alkylamides, alkoxides, alkylsilylamides, amidinates, carbonyl and/or fluoroalkyl for R being located in any of the eight available positions on the chd ligand, while R can also be oxygen O for substitution on the C positions in the chd cycle which are not involved in a double bond
for the deposition of a Ru containing film onto a substrate.

Preferably, n=1 and R is C1-C4 alkyl, preferably methyl or ethyl, while the R substituent is located on a carbon atom of the ligand having a double C bond.

According to one embodiment, the ruthenium precursor formula is Ru(CO)$_3$(1-Me 1,4-chd) i.e. (1-methylcyclohexa 1,4 diene)tricarbonyl ruthenium, for which the distribution of the ligand, together with the configuration of the cyclohexadiene optimizes the steric hindrance and the reduction of the electronic interaction and then reduces the melting point.

According to another embodiment, n is greater than 1 and R is a C1-C4 alkyl, preferably a methyl and/or ethyl, while there is at least one R on a carbon of the chd ligand having no double-bond.

The molecular structure of the cyclohexadiene ligand is freely chosen among all existing possibilities, such as 1,3-cyclohexadiene or 1,4-cyclohexadiene.

According to the invention, the reducing agent shall be preferably selected from the group consisting of H$_2$, NH$_3$, SiH$_4$, Si$_2$H$_6$, Si$_3$H$_8$, hydrogen-containing radicals. The oxygen containing fluid shall be preferably selected from the group consisting of O$_2$, O$_3$, H$_2$O, H$_2$O$_2$, oxygen-containing radicals such as O. or OH. and mixtures thereof.

To carry out the process of the invention, the pressure shall be comprised between 1 Pa and 100 000 Pa, preferably between 25 Pa and 1000 Pa.

According to the invention, the various reactants can be introduced into the reactor either simultaneously (chemical vapor deposition), sequentially (atomic layer deposition) or different combinations thereof; another example is to introduce the hydrogen-containing and/or oxygen-containing fluid continuously and to introduce the at least metal source by pulse (pulsed chemical vapor deposition).

Accordingly, the ruthenium-containing precursors defined in step b) here above shall be usually liquids, in other words having a melting point below 20° C., and more preferably shall have a melting point below 0° C.

According to another embodiment, the metal containing precursor is selected from the group consisting of: Ru(CO)$_3$ (1-Methyl-1,3-cyclohexadiene), Ru(CO)$_3$(2-Methyl-1,3-cyclohexadiene), Ru(CO)$_3$(5-Methyl,1,3-cyclohexadiene), Ru(CO)$_3$(1-Ethyl-1,3-cyclohexadiene), Ru(CO)$_3$(2-Ethyl-1,3-cyclohexadiene), Ru(CO)$_3$(5-Ethyl,1,3-cyclohexadiene), Ru(CO)$_3$(1-Propyl-1,3-cyclohexadiene), Ru(CO)$_3$(2-Propyl-1,3-cyclohexadiene), Ru(CO)$_3$(5-Propyl,1,3-cyclohexadiene), Ru(CO)$_3$(1-Butyl-1,3-cyclohexadiene), Ru(CO)$_3$(2-Butyl-1,3-cyclohexadiene), Ru(CO)$_3$(5-Butyl,1,3-cyclohexadiene), Ru(CO)$_3$(1-Methyl-1,4-cyclohexadiene), Ru(CO)$_3$(3-Methyl-1,4-cyclohexadiene), Ru(CO)$_3$(1-Ethyl-1,4-cyclohexadiene), Ru(CO)$_3$(3-Ethyl-1,4-cyclohexadiene), Ru(CO)$_3$(1-Propyl-1,4-cyclohexadiene), Ru(CO)$_3$(3-Propyl-1,4-cyclohexadiene), Ru(CO)$_3$(1-Propyl-1,4-cyclohexadiene), Ru(CO)$_3$(3-Propyl-1,4-cyclohexadiene), and mixtures thereof.

According to another embodiment, the metal containing film deposited onto the substrate shall be metallic film or metal oxide film.

BRIEF DESCRIPTION OF THE DRAWINGS

Examples of the invention should be now disclosed along with the figures which represent.

EXAMPLES

The precursors disclosed herein are usually liquid at room temperature, which means that their melting point is below 20° C., (the temperature set at manufacturing fabs). They are more preferably liquid at temperatures below 0° C.

Ru(CO)$_3$(1-Methyl-1,4-cyclohexadiene) is a light yellow precursor which is liquid at 20° C.

This precursor was then placed in a refrigerator set at 10° C. and stored during a few weeks under these conditions: Ru(CO)$_3$(1-Methyl-1,4-cyclohexadiene) was still liquid in this low temperature environment.

This precursor was then placed in a bath maintained at −50° C. for several hours: it was still liquid, even though, its viscosity increased. As a comparative test, water was frozen in less than 3 minutes under the same conditions.

The precursors described in this invention are liquid with very low melting point, which allows to use these precursors without the addition of a solvent.

Deposition of Pure Ruthenium Films:

Pure ruthenium films were deposited from temperatures above 250° C. using Ru(CO)$_3$(1-Methyl-1,4-cyclohexadiene). The liquid precursor was stored in a bubbler and delivered to the hot-wall reactor by a bubbling method. An inert gas, helium in this case, was used as a carrier gas, as well as for dilution purpose. Tests were done with and without hydrogen as co-reactant.

Figure 1A:
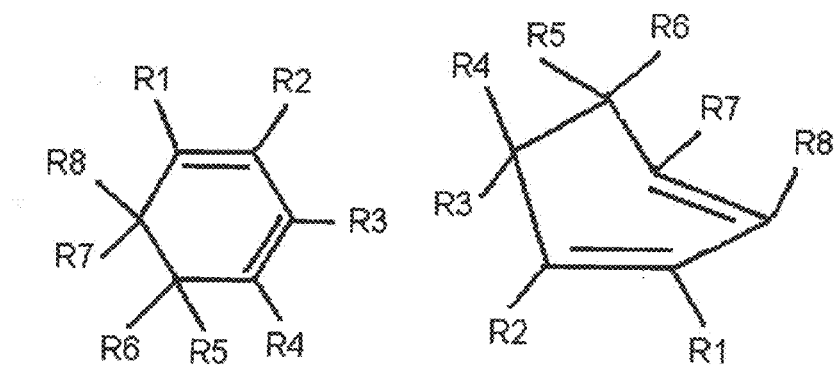
FIG. 1a the ligand 1,3-cyclohexadiene, and FIG. 1b the ligand 1,4-cyclohexadiene (face and profile) in boat position.
Figure 1B:
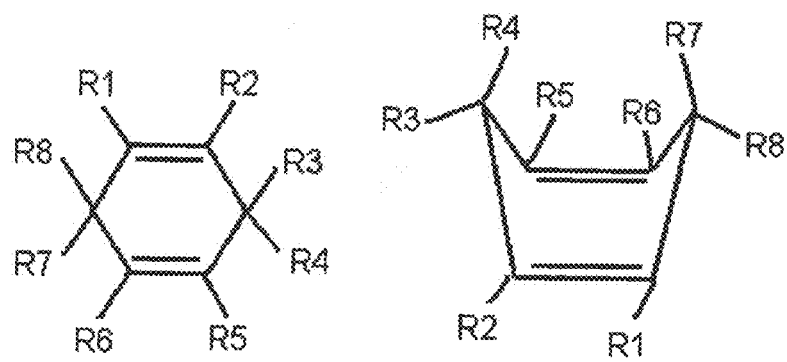
Figure 2:
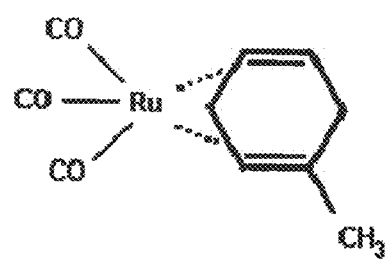
FIG. 2, the chemical structure of Ru(CO)$_3$(1-Methyl-1,4-cyclohexadiene)
Figure 3:
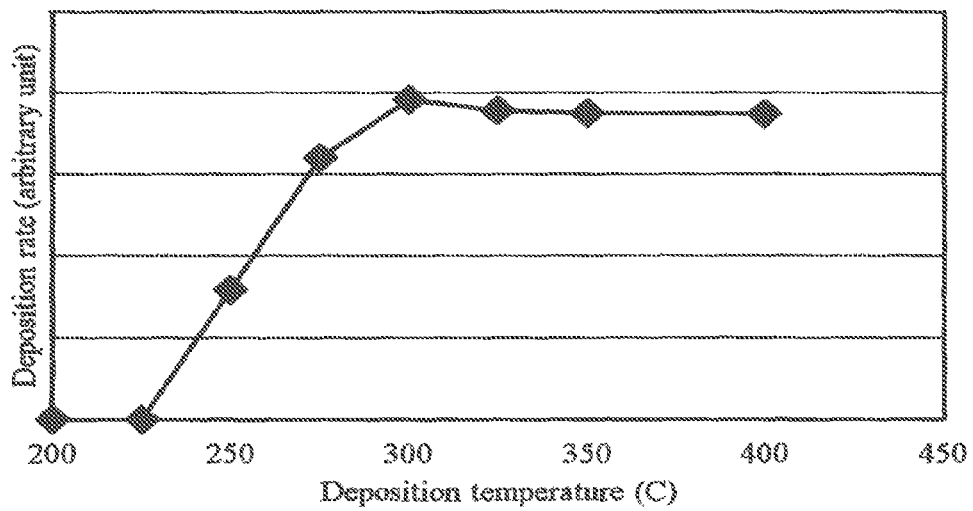
FIG. 3, the deposition rate of ruthenium films in CVD mode v. deposition temperature.

The deposition characteristics of films deposited in CVD regime are shown on FIG. 3. With a pressure of 0.5 Torr into the reactor, films were deposited at a temperature starting from 250° C., and the deposition rate reached a plateau at 350° C. FIG. 3 shows the deposition rate values of ruthenium films on silicon oxide substrates as a function of the deposition temperature. Silicon oxide was selected as a state of the art oxide materials (gate dielectrics, capacitors . . . ) in order to validate the use of the ruthenium precursors disclosed herein for the deposition of ruthenium films to be used as a metal electrode (MIM, DRAM, gate electrode, . . . ).

Figure 4:
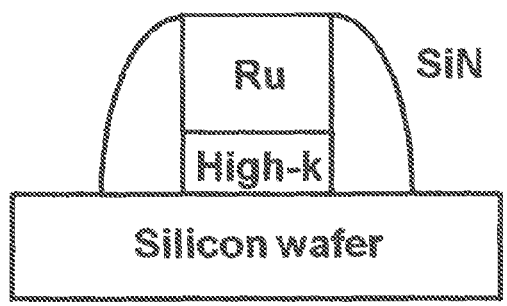
FIG. 4, a ruthenium film used as a gate electrode.

FIG. 4 represents the ruthenium film deposited in such conditions to build a gate electrode on a high k gate material deposited on a Si wafer. (Drain and Source are not represented on FIG. 4).

Figure 5:
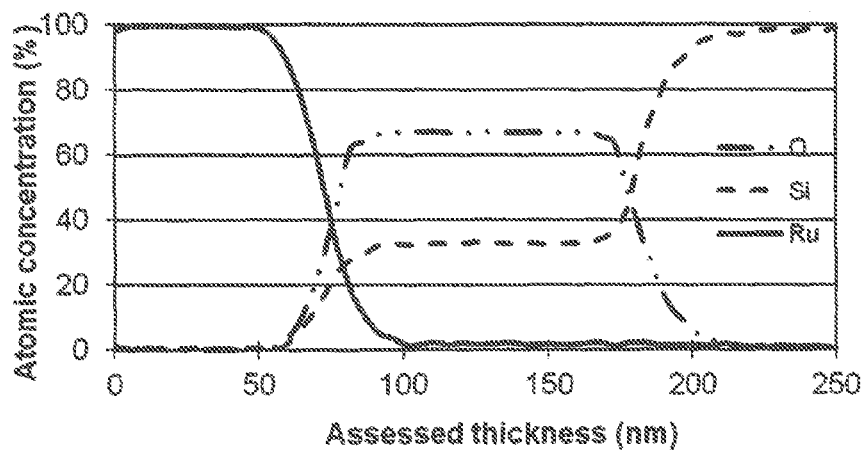
FIG. 5, the In-depth profile of a ruthenium film deposited by Ru(CO)$_3$(1-Methyl-1,4-cyclohexadiene) on a SiO$_2$/Si substrate as measured by Auger.

The results obtained are disclosed on FIG. 5 where two regimes clearly appear: the reaction rate limited regime (from 250 to 350° C.) and the transportation limited regime (above 350° C.), which characterize the CVD mode depositions.

The concentration of various elements into the ruthenium films were analyzed by an Auger spectrometer. As can be seen on FIG. 5, pure ruthenium films were deposited onto a thermal silicon dioxide layer (chosen for the same reason than above-mentioned). The concentration of oxygen in the ruthenium film was below the detection limit of AES. The concentration of carbon was determined by comparing the peak intensities of Ru-MNN (Ru1), Ru-LMM (Ru2) and C-KLL (C) of the analysis made of films obtained by sputtering method and our technique: the carbon content was found to be less than 0.5%. The purity of the films is almost similar whether hydrogen is used or not.

Incubation Time:

Depositions done in the experimental conditions described above have been performed at durations up to 60 minutes on different substrates such as SiO$_2$ and TaN. Films were deposited on silicon oxide substrates for the same reason than explained above. Ruthenium is used as a simultaneous barrier and glue layer in back-end of the line applications as exemplified on FIG. 6, or as an electrode layer on nitride materials.

Figures 6, 7:
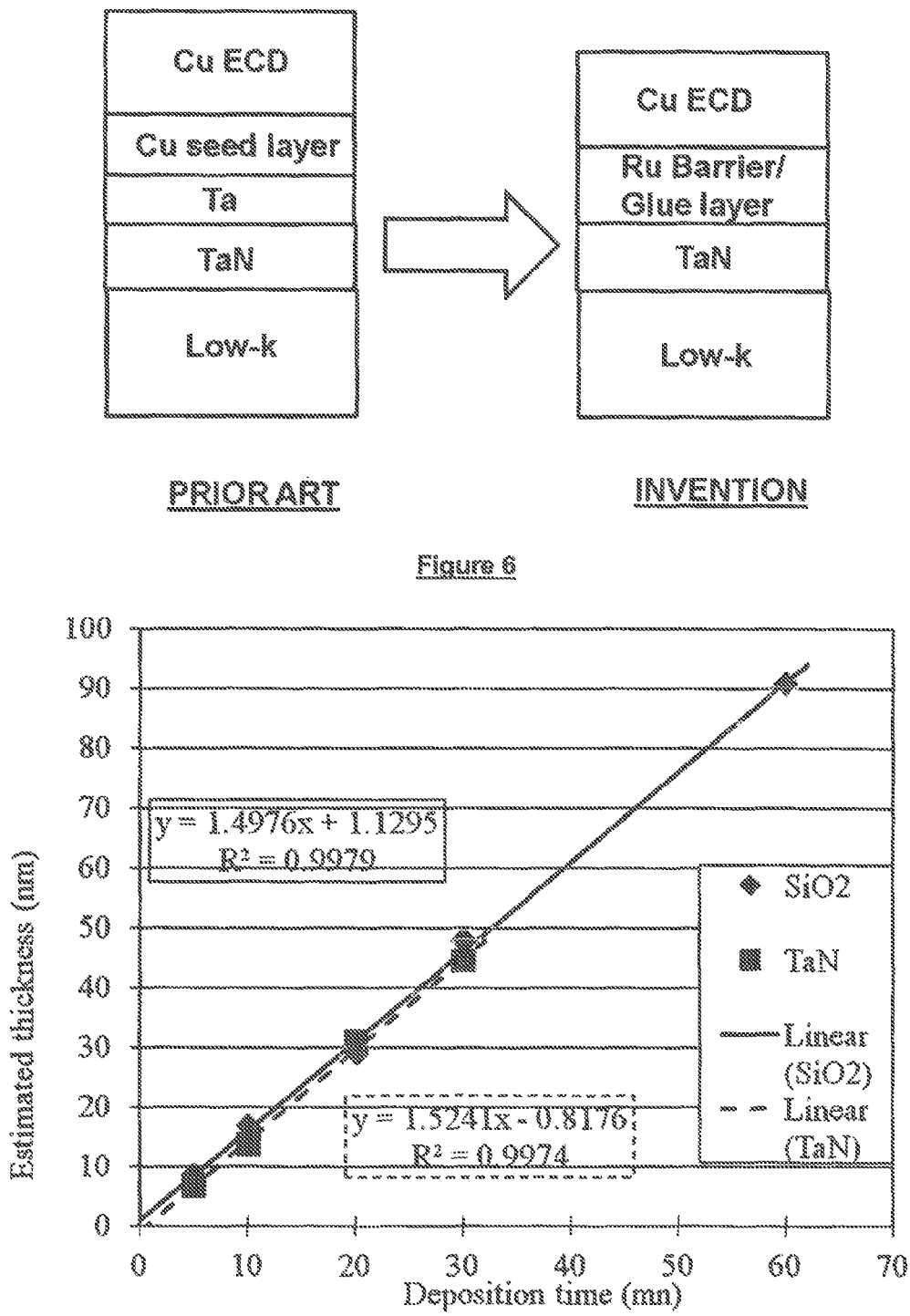
FIG. 6, multi layer deposition on a substrate (prior art v. invention)
FIG. 7, the deposition time v. estimated thickness of SiO$_2$ and TaN.

As shown on FIG. 6, TaN may be deposited on the low k material, on which the Ru layer is deposited, then the copper layer.

The Ru layer avoids deposition of two different layers, one of Ta, the other which is Cu seed layer.

As depicted on FIG. 7, a linear behavior with a y-intercept and x-intercept equal to 0 is observed whatever the substrate. From these experiments, it can be concluded that no or no significant incubation time is observed.

Atomic Layer Deposition:

This precursor Ru(CO)$_3$(1-Methyl-1,4-cyclohexadiene) and the likes are suitable for the atomic layer deposition of ruthenium and ruthenium oxide films at low temperatures (150-250° C.) using the appropriate co-reactant. It has been found that ALD is possible when the co-reactant is molecular and atomic hydrogen, as well as with ammonia and related radicals NH$_2$, NH, and oxidants.

Deposition of Ruthenium Oxide Films:

Ruthenium oxide films were deposited by making the ruthenium precursor and an oxygen containing fluid react in a deposition furnace. In this particular case, the oxygen containing fluid was oxygen.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A process for the deposition of a ruthenium containing film on a substrate, comprising the steps of:
    a) providing at least one substrate into a reactor;
    b) introducing into the reactor at least one ruthenium containing precursor selected from the group consisting of Ru(CO)$_3$(1-Methyl-1,4-cyclohexadiene), Ru(CO)$_3$(3-Methyl-1,4-cyclohexadiene), Ru(CO)$_3$(1-Ethyl-1,4-cyclohexadiene), Ru(CO)$_3$(3-Ethyl-1,4-cyclohexadiene), Ru(CO)$_3$(1-Propyl-1,4-cyclohexadiene), Ru(CO)$_3$(3-Propyl-1,4-cyclohexadiene), and mixtures thereof;
    c) depositing the ruthenium containing film onto the at least one substrate.

2. The process of claim 1, wherein the ruthenium containing film is deposited in a CVD process.

3. The process of claim 1, wherein the ruthenium containing film is deposited in an ALD process.

4. The process of claim 1, wherein the ruthenium containing film is deposited in a pulsed CVD process.

5. The process of claim 1, wherein the temperature conditions are selected from a point in a range of 100° C. to 500° C.

6. The process of claim 5, wherein the temperature conditions are selected from a point in a range of 150° C. to 350° C.

7. The process of claim 1, wherein the pressure in the reactor is maintained between 1 Pa and 10$^5$ Pa.

8. The process of claim 7, wherein the pressure in the reactor is maintained between 25 Pa and 10$^3$ Pa.

9. The process of claim 1, wherein the ruthenium containing film is ruthenium.

10. The process of claim 1, further comprising the step of providing at least one reducing fluid into the reactor, said reducing fluid being selected from the group consisting of H$_2$, NH$_3$, SiH$_4$, Si$_2$H$_6$, Si$_3$H$_8$, hydrogen containing fluids, hydrogen radicals, and mixtures thereof.

11. The process of claim 10, wherein the ruthenium containing film is ruthenium.

12. The process of claim 11, wherein the ruthenium containing film is deposited in a CVD process.

13. The process of claim 1, further comprising the step of providing at least one oxygen containing fluid into the reactor, the at least one oxygen containing fluid being selected from the group consisting of O$_2$, O$_3$, H$_2$O, H$_2$O$_2$, oxygen containing radicals, and mixtures thereof.

14. The process of claim 13, wherein the ruthenium containing film is ruthenium oxide.

15. The process of claim 14, wherein the ruthenium oxide is deposited in a CVD process.

16. The process of claim 14, wherein the ruthenium oxide is deposited in an ALD process.

17. The process of claim 14, wherein the ruthenium oxide is deposited in a pulsed CVD process.

18. The process of claim 1, wherein the at least one ruthenium containing precursor selected from the group consisting of Ru(CO)$_3$(1-Methyl-1,4-cyclohexadiene), Ru(CO)$_3$(1-Ethyl-1,4-cyclohexadiene), and Ru(CO)$_3$(1-Propyl-1,4-cyclohexadiene).

19. The process of claim 1, wherein the at least one ruthenium containing precursor selected from the group consisting of Ru(CO)$_3$(3-Methyl-1,4-cyclohexadiene), Ru(CO)$_3$(3-Ethyl-1,4-cyclohexadiene), and Ru(CO)$_3$(3-Propyl-1,4-cyclohexadiene).

* * * * *